United States Patent
Yamada

(10) Patent No.: US 8,212,275 B2
(45) Date of Patent: Jul. 3, 2012

(54) LIGHT-EMITTING DEVICE

(75) Inventor: Masashi Yamada, Ina (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 13/028,404

(22) Filed: Feb. 16, 2011

(65) Prior Publication Data
US 2011/0198649 A1    Aug. 18, 2011

(30) Foreign Application Priority Data
Feb. 16, 2010   (JP) .................... 2010-031567

(51) Int. Cl.
*H01L 33/58*   (2010.01)
(52) U.S. Cl. ............ 257/98; 257/99; 257/E33.068
(58) Field of Classification Search ......... 257/13, 257/98–99
See application file for complete search history.

(56) References Cited

U.S. PATENT DOCUMENTS

2007/0075306 A1*  4/2007  Hayashi et al. ........... 257/13
2009/0200570 A1*  8/2009  Mori et al. ............... 257/99

FOREIGN PATENT DOCUMENTS

JP       2005-093896       4/2005

* cited by examiner

*Primary Examiner* — Dung A. Le
(74) *Attorney, Agent, or Firm* — Scully, Scott, Murphy & Presser, P.C.

(57) ABSTRACT

A light-emitting device according to an embodiment includes: a blue color LED including a first principal surface, a second principal surface and a side surface, the blue color LED producing light; and a package portion in which a recess portion, which is a light shield portion accommodating the blue color LED with no gap on the side surface side, thereby preventing release of the light from the side surface, is formed.

10 Claims, 6 Drawing Sheets

LIGHT-EMITTING DEVICE

CROSS REFERENCE TO RELATED APPLICATION

This application claims the benefit of Japanese Application No. 2010-031567 filed in Japan on Feb. 16, 2010, the contents of which are incorporated herein by this reference.

BACKGROUND OF THE INVENTION

1. Field of the Invention

Embodiments of the present invention relate to a light-emitting device including a light-emitting element.

2. Description of the Related Art

Light-emitting devices using semiconductor light-emitting elements have a compact size and good power efficiency. Therefore, light-emitting devices including semiconductor light-emitting elements such as light-emitting diodes (LEDs) or laser diodes (hereinafter, referred to as "LD(s)") are employed for various types of light sources. Here, light produced by a semiconductor light-emitting element has a steep spectral distribution. Accordingly, for a light-emitting device producing white color light, it is necessary to convert the wavelengths of light produced by the semiconductor light-emitting elements.

For a method for producing white color light, there are three main known methods described below. First, there is a first light-emitting device combining a blue color LED and a YAG phosphor emitting yellow color light. In the first light-emitting device, the YAG phosphor is excited by light from the blue color LED to produce white color light formed by a light mixture of blue color light and yellow color light. In a second light-emitting device combining an ultraviolet LED and phosphors, three types of phosphors, which emit blue, green and red color light, respectively, are used for the phosphors. The second light-emitting device produces white color light using a light mixture of the blue, green and red color light from the phosphors. There is also a third light-emitting device of what is called a three band mixture type including a combination of a blue color LED, a green color LED and a red color LED.

For example, Japanese Patent Application Laid-Open Publication No. 2005-93896 discloses a variation of the first light-emitting device combining a blue color LED and two types of phosphors. As illustrated in FIG. 1, a light-emitting device 101, in which a mortar-shaped recess portion is provided in a base material 130 and an LED chip 104 is disposed on a bottom surface 103 of the recess portion, includes a first wavelength conversion member 105 prepared by dispersing a first phosphor, which produces green color fluorescence, in a light transmissive resin, a second wavelength conversion member 106 prepared by dispersing a second phosphor, which produces red color fluorescence, in a light transmissive resin, and a reflective surface 102 formed on an inner surface of the recess portion.

SUMMARY OF THE INVENTION

A light-emitting device according to an aspect of the present invention includes: a light-emitting element including a first principal surface, a second principal surface and a side surface, the light-emitting element producing light; and a light shield portion that prevents release of the light from the side surface.

DETAILED DESCRIPTION OF THE PREFERRED EMBODIMENTS

First Embodiment

Figure 1:
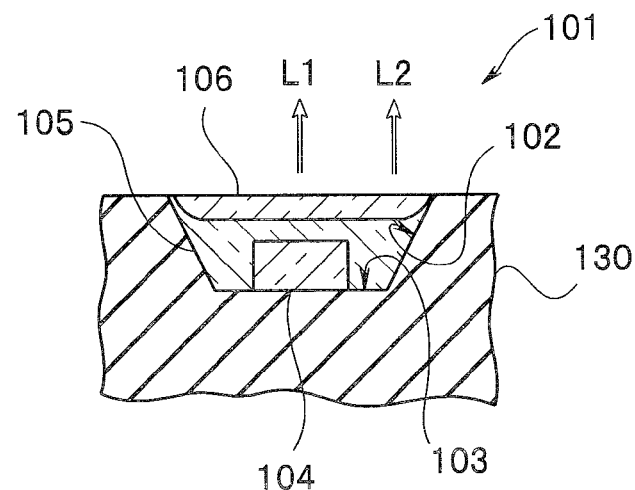
FIG. 1 is a cross-sectional diagram for illustrating a structure of a known light-emitting device.
Figure 2:
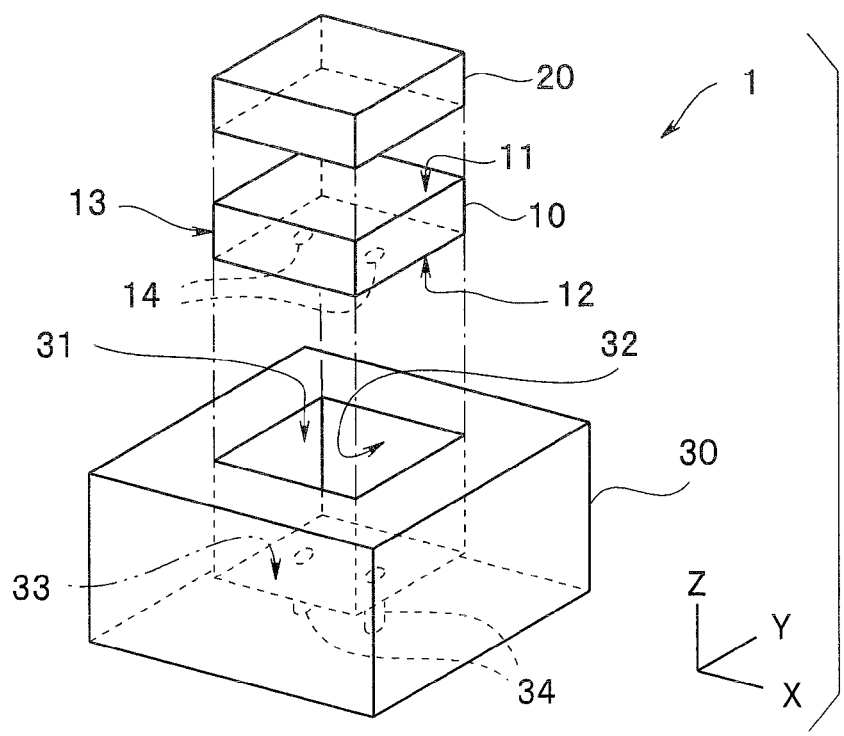
FIG. 2 is an exploded diagram for illustrating a structure of a light-emitting device according to a first embodiment.
Figure 3:
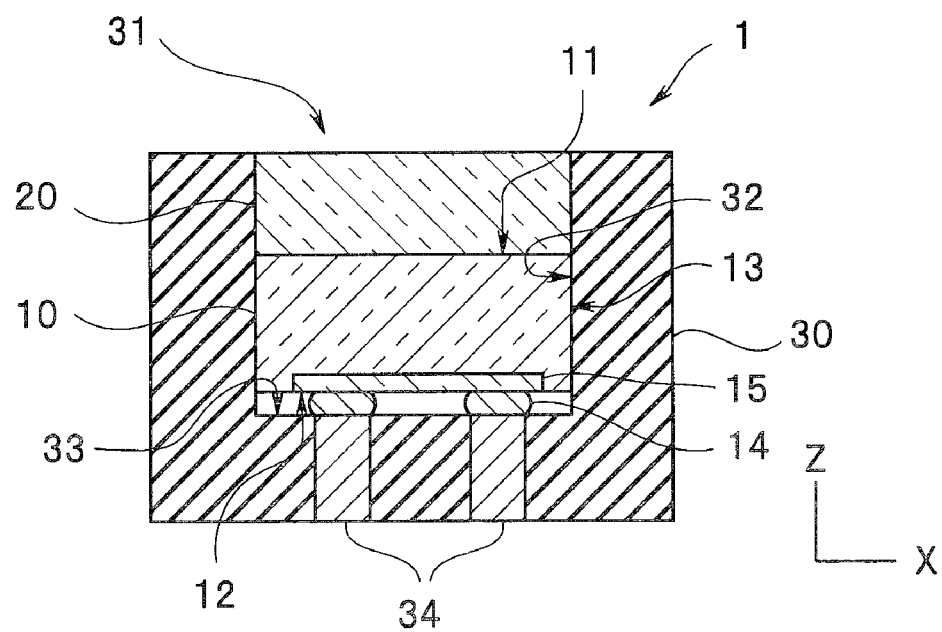
FIG. 3 is a cross-sectional diagram for illustrating the structure of the light-emitting device according to the first embodiment.

FIG. 2 is an exploded diagram for illustrating a structure of a light-emitting device 1 according to a first embodiment, and FIG. 3 is a cross-sectional diagram for illustrating the structure of the light-emitting device 1. The diagrams referred to below are schematic diagrams provided for description, and the aspect ratio, etc., in the Figures are different from those of actual ones.

As illustrated in FIGS. 2 and 3, the light-emitting device 1 according to the first embodiment of the present invention includes a blue color light-emitting diode (blue color LED) 10, which is a light-emitting element, a wavelength conversion layer 20, and a package portion 30 including a opaque material. The blue color LED 10 includes a first principal surface 11, a second principal surface 12, and four (X and Y direction) side surfaces (side walls) 13. On the second principal surface 12, a light emitting portion 15 (see FIG. 3), and bumps 14, which are electrode portions for supplying a drive current to the light emitting portion 15, are formed.

The wavelength conversion layer 20 disposed on the first principal surface 11 of the blue color LED 10, which includes a light transmissive resin in which a YAG (yttrium/aluminum/garnet) phosphor is dispersed, converts blue color light produced by the blue color LED 10 into yellow color light, which has a longer wavelength. For the light transmissive resin, e.g., a thermal cure or ultraviolet cure epoxy-based or acryl-based resin is used.

The wavelength conversion layer 20 may be subjected to cure treatment after the wavelength conversion layer 20 is disposed on the first principal surface 11 of the blue color LED 10 in an uncured state in which the wavelength conversion layer 20 has fluidity, or may also be subjected to cure treatment in advance and then joined to the blue color LED 10 in the form of a resin sheet.

The package portion 30 includes an opaque material that does not transmit at least light produced by the blue color LED 10, such as a metal, a resin or a ceramic. In a part that is substantially a center of the package portion 30, a recess portion 31 including four (X and Y direction) side walls (side surfaces) 32 and a bottom portion 33. The package portion 30 also includes joining portions (not illustrated) joined to the two bumps 14 of the blue color LED 10, and through wires 34, which are lead wire portions extended from the joining portions to an outer surface (bottom surface) of the package portion 30 at the bottom portion 33 of the recess portion 31. Hereinafter, a plural of components having a same function may be expressed with alphabets and/or numerals suffixed to a reference numeral, which consists of two digits, deleted, or numerals further suffixed thereto. For example, bumps 14, bumps 14A and bumps 14A1 are all components having a same function.

Each through wire 34 is prepared by, for example, charging a conductive paste including, e.g., a silver-palladium alloy, in a through hole and performing thermal treatment thereof The package portion 30 and the blue color LED 10 may be joined by solder jointing, bonding wire jointing or jointing using an ACF (anisotropic conductive adhesive film), which is an anisotropic conductive material, an NCF (non conductive adhesive film), which is a nonconductive material, or an NCP (non conductive paste). For a material for the bumps 14, e.g., copper, gold, solder, lead-free solder can be used.

The recess portion 31 has a size enabling accommodation of the blue color LED 10 with the second principal surface 12 as the bottom portion side and with no gap on the side surface 13 side. In other words, a blue color LED 10 having a size that is the same as the size of an opening of the recess portion 31 of the package portion 30 is mounted in the recess portion 31. Accordingly, the side walls 32 of the recess portion 31 are light shield portions preventing release of light from the side surfaces 13 of the blue color LED 10. In other words, the "no gap" does not mean physically perfect contact, but it is only necessary that the side walls 32 of the recess portion 31 sufficiently function as light shield portions. Alternatively, for example, a shield material may be charged in a gap on the side surface 13 side after the package portion 30 is mounted in the recess portion 31. In FIG. 2, the opening of the recess portion 31 has a quadrangular shape in agreement with the blue color LED 10 having a quadrangular column shape, but the opening may have a polygonal shape or a circular shape according to the shape of the blue color LED 10.

In the light-emitting device 1, the light shield portions prevent release of light from the side surfaces 13 of the blue color LED 10, enabling production of white color light with an even intensity and color without color and light-emitting intensity unevenness. Accordingly, in particular, the light-emitting device 1 can be favorably used in an illumination device for a medical endoscope.

Furthermore, the light-emitting device 1 can easily be installed because a drive current can be supplied to the light emitting portion 15 from the outer surface of the package portion 30 via the through wires 34.

As illustrated in FIG. 3, in the light-emitting device 1, the wavelength conversion layer 20 is also accommodated inside the recess portion 31 of the package portion 30 with no gap. This is because the wavelength conversion layer 20 is formed by pouring an uncured phosphor resin solution, which has fluidity, into a space at an upper part of the recess portion 31 after the blue color LED 10 is accommodated in the recess portion 31 of the package portion 30. The light-emitting device 1 with the wavelength conversion layer 20 accommodated in the recess portion 31 with no gap on the side surface side, in other words, the light-emitting device 1 including light shield portions preventing release of light from the side surfaces of the wavelength conversion layer 20, enables production of white color light with a more even intensity and color than those produced by a light-emitting device in which light is released from the side surfaces of the light-emitting device wavelength conversion layer 20.

The light shield portions of the light-emitting device may be prepared simply by applying a shield coating material to the side surfaces 13 of the blue color LED 10. However, from the perspective of the handing and the mechanical strength of the light-emitting device, it is preferable that the light shield portions be the recess portion 31 (the side walls 32) formed in the package portion 30.

Variations 1 and 2 of First Embodiment

Next, a light-emitting device 1A according to variation 1 of the first embodiment and a light-emitting device 1B according to variation 2 of the first embodiment will be described. Since the light-emitting devices 1A and 1B according to the present variations are similar to the light-emitting device 1 according to the first embodiment, components that are the same as those of the light-emitting device 1 are provided with the same reference numerals as those of the light-emitting device 1, and a description thereof will be omitted.

Figure 4:
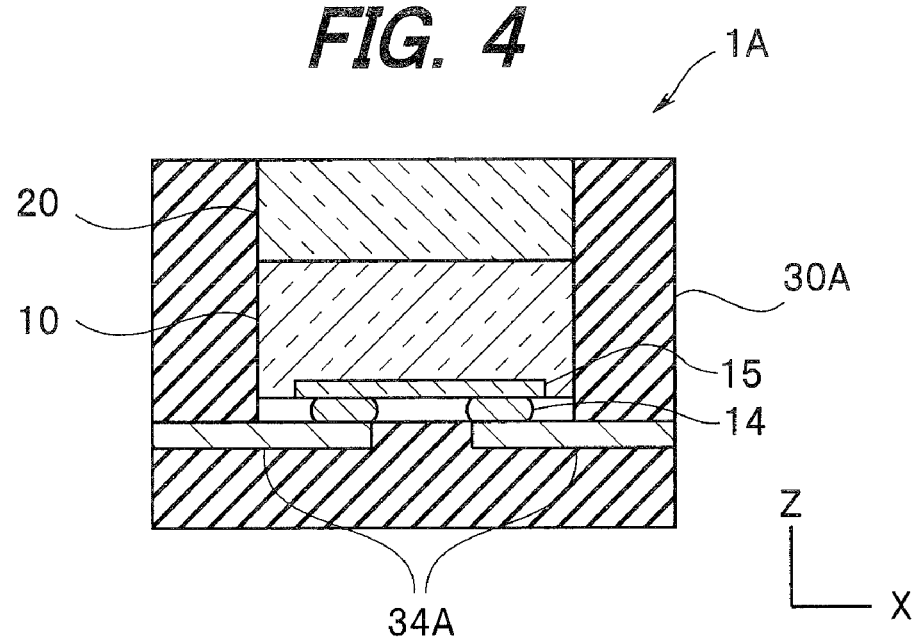
FIG. 4 is a cross-sectional diagram for illustrating a structure of a light-emitting device according to variation 1 of the first embodiment.
Figure 5:
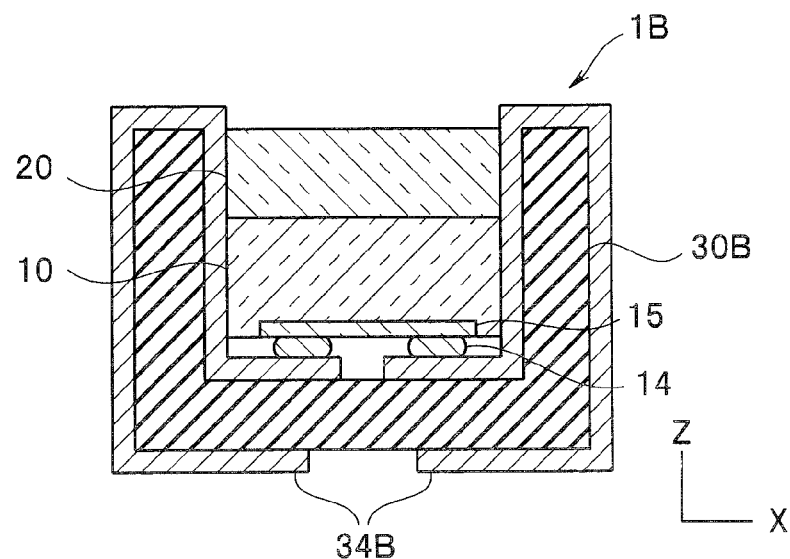
FIG. 5 is a cross-sectional diagram for illustrating a structure of a light-emitting device according to variation 2 of the first embodiment.

A package portion 30A of the light-emitting device 1A according to variation 1 of the first embodiment, which is illustrated in FIG. 4, includes through wires 34A, which are connected to bumps 14, on a side surface (in an X direction). Also, a package portion 30B of the light-emitting device 1B according to variation 2 of the first embodiment, which is illustrated in FIG. 5, includes lead wires 34B, which are connected to bumps 14, on side walls 32, an upper surface and outer walls of a recess portion 31. The lead wires 34B have a same function as that of the through wires 34.

In other words, the light-emitting device 1A according to variation 1 of the first embodiment, which is illustrated in FIG. 4, and the light-emitting device 1B according to variation 2 of the first embodiment, which is illustrated in FIG. 5, also enable provision of the advantages that are the same as those of the light-emitting device 1 according to the present embodiment.

The lead wires or the through wires for supplying a drive current to a blue color LED 10 accommodated (mounted) in the recess portion of the package portion can be configured by various known methods and materials. For example, the lead wires or the through wires can be formed by, e.g., a direct write method, a one-shot laser method used for an MID (molded interconnect device), a printing method, a plating method or an etching method, using, e.g., gold, silver, copper, nickel, aluminum, a silver-palladium alloy, tungsten or titanium.

Second Embodiment

Next, a light-emitting device 1C according to a second embodiment will be described. Since the light-emitting device 1C according to the present embodiment is similar to the light-emitting device 1 according to the first embodiment, components that are the same as those of the light-emitting device 1 are provided with the same reference numerals as those of the light-emitting device 1, and a description thereof will be omitted.

Figure 6:
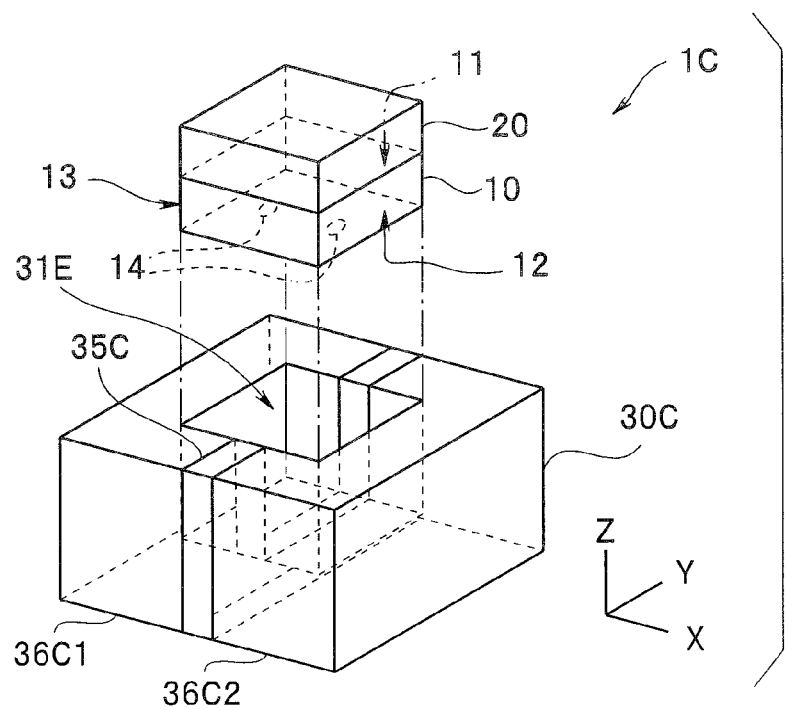
FIG. 6 is an exploded diagram for illustrating a structure of a light-emitting device according to a second embodiment.

As illustrated in FIG. 6, a package portion 30C of the light-emitting device 1C includes two conductive portions 36C1 and 36C2 having conductivity, which are electrically insulated from each other by an insulating portion 35C, and the conductive portions 36C1 and 36C2 function as lead wire portions. In other words, the package portion 30C functions as lead electrodes (anode/cathode) of a blue color LED 10. The conductive portions 36C1 and 36C2 are prepared by means of, e.g., machining or molding, using, e.g., a metal such as aluminum, copper, nickel or gold, carbon or a conductive resin.

Each of the conductive portions 36C1 and 36C2 is acceptable as long as it has conductivity at least at, e.g., a surface layer thereof Accordingly, after all the surfaces of the package portion, which include a non-conductive material such as ceramic, are coated with a conductive film by means of, e.g., an application method, a deposition method or a plating method, the conductive film at the insulating portion 35C may be removed by means of, e.g., etching. Alternatively, the parts of the conductive portions or conductive film other than the electric connection parts may be coated with an insulating film. Although the conductive portions of the above-described structure are similar to the lead wires 34B of the light-emitting device 1B illustrated in FIG. 5, the conductive portions are different from the lead wires 34B in that the conductive portions have a sheet-like configuration while the lead wires 34B have a strip-like configuration.

The light-emitting device 1C according to the present embodiment provides the advantages of, e.g., the light-emitting device 1 according to the first embodiment. In addition, the light-emitting device 1C eliminates the need to provide, e.g., through electrodes, and thus, can easily be manufactured.

Variations 1 to 4 of the Second Embodiment

Next, a light-emitting device 1D according to variation 1 of the second embodiment, a light-emitting device 1E according to variation 2 of the second embodiment, a light-emitting device 1F according to variation 3 of the second embodiment and a light-emitting device 1G according to variation 4 of the second embodiment will be described. Since the light-emitting devices 1D to 1G according to the present variations are similar to the light-emitting device 1C according to the second embodiment, components that are the same as those of the light-emitting device 1C are provided with the same reference numeral as those of the light-emitting device 1C, and a description thereof will be omitted.

Figure 7:
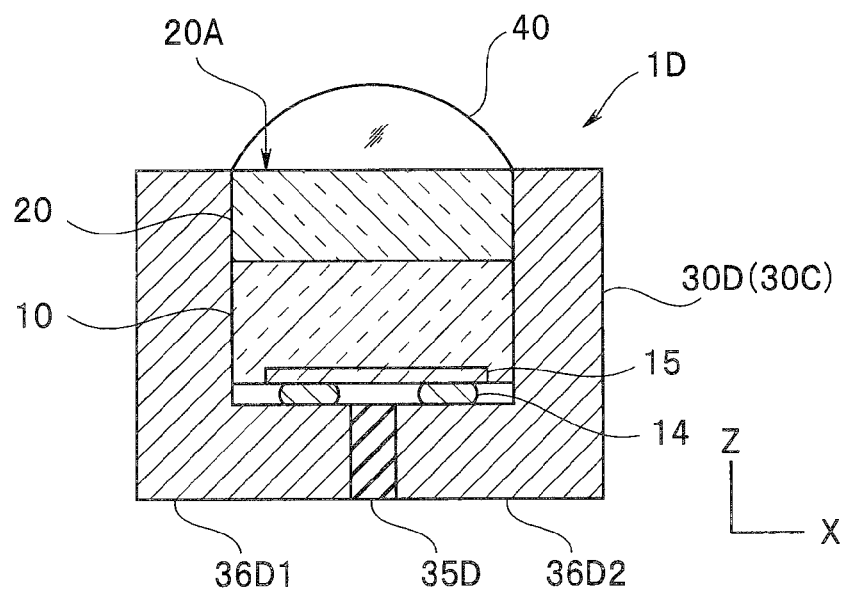
FIG. 7 is a cross-sectional diagram for illustrating a structure of a light-emitting device according to variation 1 of the second embodiment.

As illustrated in FIG. 7, the light-emitting device 1D according to variation 1 of the second embodiment includes a lens 40, which is an optical member, on a light-emitting surface 20A. A light-emitting surface refers to a surface of a light-emitting device, from which light is released to the outside, and in the light-emitting device 1D with the structure illustrated in FIG. 7, a light-emitting surface is an upper surface of a wavelength conversion layer 20. The light-emitting device including the optical member enables control (e.g., condensation/diffusion) of emitted light. A package portion 30D of the light-emitting device 1D, which has a configuration that is similar to that of the package portion 30C of the light-emitting device 1C, includes two conductive portions 36D1 and 36D2 having conductivity, which are electrically insulated by an insulating portion 35D.

The optical member disposed on the light-emitting surface 20A may be, e.g., a prism, an optical filter or a glass fiber. The lens, which is a collecting lens or a diffusing lens selected according to the usage, is joined to the light-emitting surface 20A by means of, e.g., bonding or thermocompression bonding. The lens is prepared by, e.g., a potting method or a molding method, using, e.g., a transparent resin, such as an epoxy resin, an acrylic resin, a polycarbonate resin or a polystyrene resin, or glass. The prism may be selected from, e.g., a Porro prism, a roof prism or a pentaprism. The optical filter may be selected from, e.g., a polarizing filter or a neutral density filter.

Figure 8:
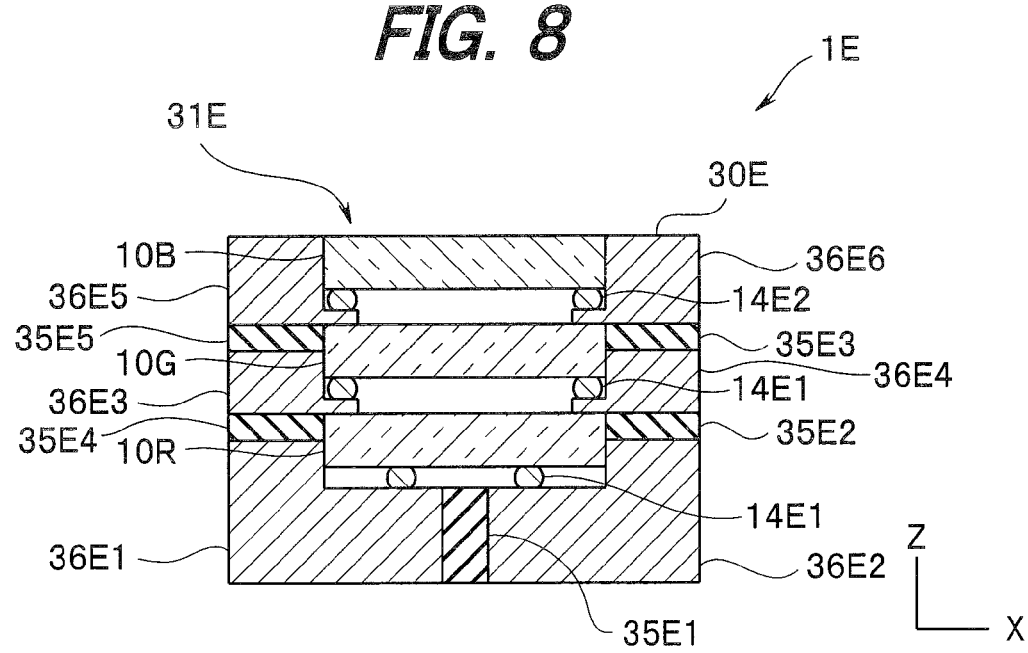
FIG. 8 is a cross-sectional diagram for illustrating a structure of a light-emitting device according to variation 2 of the second embodiment.

Next, the light-emitting device 1E according to variation 2 of the second embodiment, which is illustrated in FIG. 8, includes a plurality of light-emitting elements, which produce light of different wavelengths, stacked in a recess portion of a package portion 30E. In other words, in the light-emitting device 1E, a red color LED 10R, a green color LED 10G and a blue color LED 10B are stacked. Conductive portions 36E1 to 36E6, which are connected to respective bumps 14E1 to 14E3 of the LEDs, are insulated from each other via insulating portions 35E1 to 35E5.

The red color LED 10R, the green color LED 10G and the blue color LED 10B are accommodated in the recess portion 31E of the package portion 30E with no gap on the respective side surface sides. Although the light-emitting device 1E is a three band mixture-type light-emitting device, the light-emitting device 1E prevents release of light from the side surfaces of the LEDs, enabling production of white color light with an even intensity and color.

Figure 9:
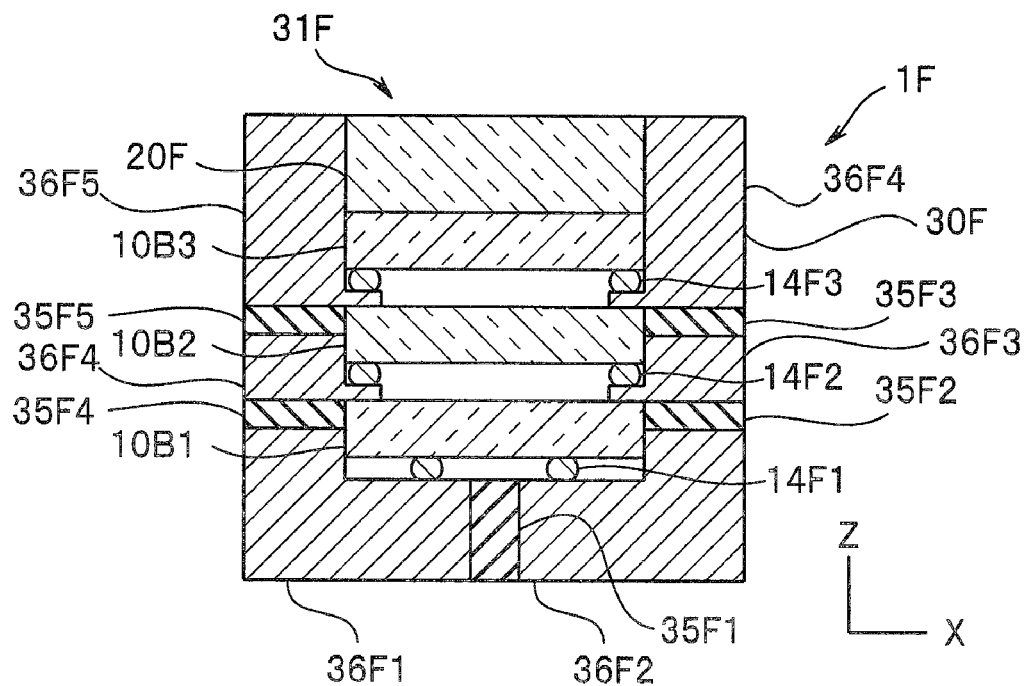
FIG. 9 is a cross-sectional diagram for illustrating a structure of a light-emitting device according to variation 3 of the second embodiment.

Next, the light-emitting device 1F according to variation 3 of the second embodiment, which is illustrated in FIG. 9, includes a plurality of light-emitting elements, which produce light of a same wavelength, stacked in a recess portion 31F of a package portion 30F. In other words, in the light-emitting device 1F, three blue color LEDs 10B1, 10B2 and 10B3 are accommodated in the recess portion 31F of the package portion 30E with no gap on the respective side surface sides, and a wavelength conversion layer 20F including a YAG phosphor, is disposed on an upper surface of the blue color LED 10B3.

The light-emitting device 1F provides advantages similar to those of the light-emitting device 1 according to the first embodiment, and in addition, enables production of light that is more intensive than that of the light-emitting device 1 because the light-emitting device 1F further includes the plurality of LEDs.

Although in FIG. 9, conductive portions 36F1 to 36F6 connected to bump 14F1 to 14F3 of the blue color LEDs 10B1, 10B2 and 10B3 are insulated from each other via insulating portions 35F1 to 35F5, the conductive portions may simply be separated into two parts, i.e., an anode and a cathode.

Figure 10:
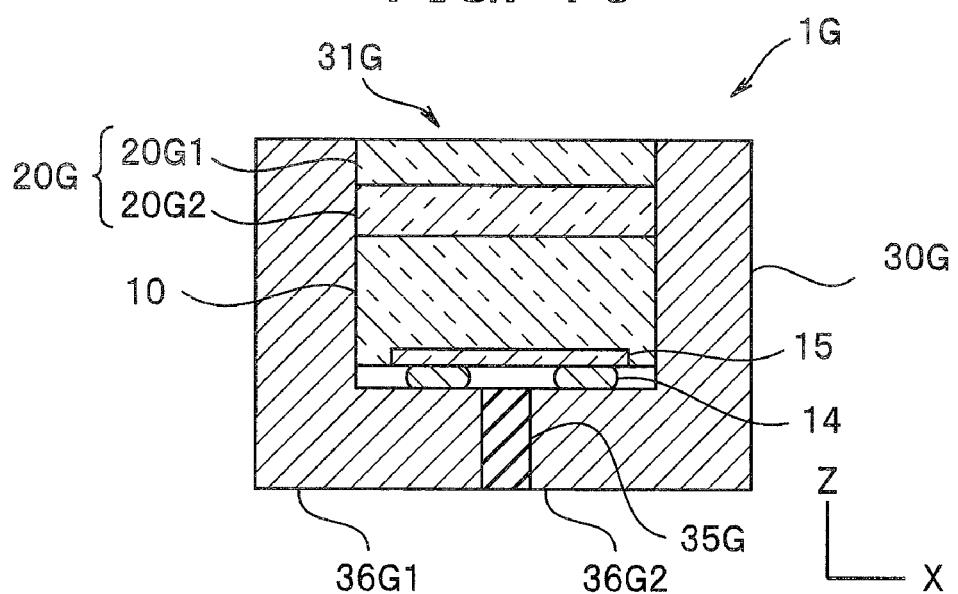
FIG. 10 is a cross-sectional diagram for illustrating a structure of a light-emitting device according to variation 4 of the second embodiment.

Next, a package portion 30G of the light-emitting device 1G according to variation 4 of the second embodiment, which is illustrated in FIG. 10, includes conductive portions 36G1 and 36G2 insulated from each other via an insulating portion 35G. A wavelength conversion layer 20G includes two layers that convert light into light of different wavelengths. In other words, the light-emitting device 1G includes a blue color LED 10, a wavelength conversion layer 20G2 including a phosphor that converts blue color light into green color light, and a wavelength conversion layer 20G1 including a phosphor that converts blue color light into red color light. For the light-emitting device, it is possible to use an ultraviolet LED for a light-emitting element, and a multilayer or single-layer wavelength conversion layer that converts ultraviolet light into blue, green and red color light or, e.g., a wavelength conversion layer that converts ultraviolet light into light of complementary colors such as cyan and magenta.

As described above, a light-emitting device including light shield portions that prevent release of light from the side surfaces of light-emitting element(s) enables provision of advantages similar to those of, e.g., the light-emitting device 1 even though the light-emitting device has an light emission mechanism and structure that are different from those of, e.g., the light-emitting device 1 according to the first embodiment. Although an LED is preferable for use as the light-emitting element, any semiconductor light-emitting element, such as an LD, can provide similar advantages, and furthermore, the light-emitting element may be an organic EL element.

Third Embodiment

Next, a light-emitting device 1H according to a third embodiment will be described. Since the light-emitting device 1H according to the present embodiment is similar to the light-emitting device 1C according to the second embodiment, components that are the same as those of the light-emitting device 1C are provided with the same numerals as those of the light-emitting device 1C, and a description thereof will be omitted.

Figure 11:
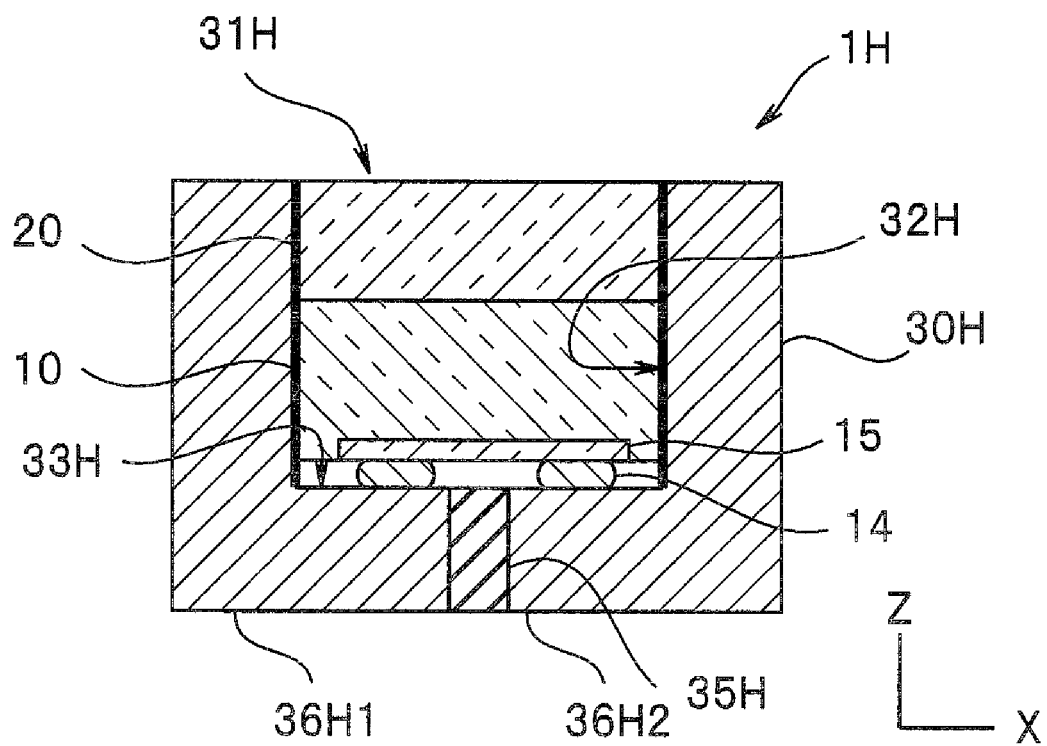
FIG. 11 is a cross-sectional diagram for illustrating a structure of a light-emitting device according to a third embodiment.

As illustrated in FIG. 11, in a package portion 30H of the light-emitting device 1H, conductive portions 36H1 are 36H2 are insulated from each other via an insulating portion 35H. Side walls 32H of a recess portion 31H, which are light shield portions, have a function as a reflector reflecting blue color light released from side surfaces 13 by a blue color LED 10. As with the light-emitting device 1C according to the second embodiment, the package portion 30H (the conductive portions 36H1 and 36H2) of the light-emitting device 1H include a metal such as aluminum; however, the side walls 32H have a high reflectivity as a result of mirror finishing. In other words, the side walls 32H of the package portion 30H have a reflector portion function in addition to a light shield portion function and an electrode portion function.

The side walls 32H having a reflector portion function may be prepared by forming a reflective film having a high reflectivity including, e.g., aluminum, gold or nickel by means of, e.g., a deposition method or a plating method. Also, a bottom portion 33H of the recess portion 31H may be subjected to processing for providing a high reflectivity to the bottom portion 33H or a reflective film may be formed on the bottom portion 33H.

The light-emitting device in which the side walls 32H, which are light shield portions, reflect light produced by the LED can use light released from the side surfaces of the LED as well, and thus, can produce light with a higher intensity, in addition to the advantages provided by, e.g., the light-emitting device 1 according to the first embodiment.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A light-emitting device comprising:
a light-emitting element including a first principal surface, a second principal surface and a side surface, the light-emitting element producing light; and
a light shield portion that prevents release of the light from the side surface,
wherein the light-emitting element includes a light emitting portion that produces the light, and an electrode portion that supplies a drive current to the light emitting portion, on the second principal surface; and
the light shield portion is a package portion made of an opaque material, the package portion including a recess portion capable of accommodating the light-emitting element with no gap on the side surface side, with the second principal surface positioned on a bottom side of the recess portion.

2. The light-emitting device according to claim 1, wherein a plurality of the light-emitting elements that produce light of different wavelengths are stacked in the recess portion.

3. The light-emitting device according to claim 1, further comprising a wavelength conversion layer disposed on the first principal surface, the wavelength conversion layer converting the light produced by the light-emitting element into light in a longer wavelength band.

4. The light-emitting device according to claim 3, wherein the wavelength conversion layer is accommodated in the recess portion with no gap on the side surface side.

5. The light-emitting device according to claim 4, wherein the wavelength conversion layer includes a plurality of layers that convert the light into light in different wavelength bands.

6. The light-emitting device according to claim 4, wherein the package portion includes a lead wire portion extending from a joining portion joined to the electrode portion of the light-emitting element to an outer surface of the package portion.

7. The light-emitting device according to claim 6, wherein the package portion includes a plurality of conductive portions that are electrically insulated from each other by an insulating portion, and the plurality of conductive portions include the lead wire portion.

8. The light-emitting device according to claim 1, wherein the light shield portion reflects the light produced by the light-emitting element.

9. The light-emitting device according to claim 1, wherein the light-emitting element includes a light-emitting diode.

10. The light-emitting device according to claim 1, further comprising an optical member on a light-emitting surface.

* * * * *